US011662821B2

(12) United States Patent
Khenkin et al.

(10) Patent No.: US 11,662,821 B2
(45) Date of Patent: May 30, 2023

(54) IN-SITU MONITORING, CALIBRATION, AND TESTING OF A HAPTIC ACTUATOR

(71) Applicant: Cirrus Logic International Semiconductor Ltd., Edinburgh (GB)

(72) Inventors: Aleksey Khenkin, Austin, TX (US); Jun Yan, Austin, TX (US); Marco Janko, Austin, TX (US); Michael McKnight, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 365 days.

(21) Appl. No.: 16/850,904

(22) Filed: Apr. 16, 2020

(65) Prior Publication Data

US 2021/0325967 A1    Oct. 21, 2021

(51) Int. Cl.
| | |
|---|---|
| *G06F 3/01* | (2006.01) |
| *G01R 33/028* | (2006.01) |
| *H02N 11/00* | (2006.01) |
| *H02N 2/14* | (2006.01) |
| *H02N 1/00* | (2006.01) |
| *H01L 41/04* | (2006.01) |
| *H01L 41/09* | (2006.01) |
| *H01L 41/083* | (2006.01) |

(52) U.S. Cl.
CPC ............ *G06F 3/016* (2013.01); *G01R 33/028* (2013.01); *H02N 1/006* (2013.01); *H02N 2/14* (2013.01); *H02N 2/142* (2013.01); *H02N 11/00* (2013.01); *H01L 41/042* (2013.01); *H01L 41/083* (2013.01); *H01L 41/09* (2013.01)

(58) Field of Classification Search
CPC ....... G06F 3/016; G01R 33/028; H02N 11/00; H02N 2/142; H02N 2/14; H02N 1/006; B06B 1/0261; H01L 41/042; H01L 41/09; H01L 41/083
See application file for complete search history.

(56) References Cited

U.S. PATENT DOCUMENTS

| | | |
|---|---|---|
| 3,686,927 A | 8/1972 | Scharton |
| 4,902,136 A | 2/1990 | Mueller et al. |
| 5,374,896 A | 12/1994 | Sato et al. |
| (Continued) | | |

FOREIGN PATENT DOCUMENTS

| | | |
|---|---|---|
| AU | 2002347829 | 4/2003 |
| CN | 103165328 A | 6/2013 |
| (Continued) | | |

OTHER PUBLICATIONS

International Search Report and Written Opinion of the International Searching Authority, International Application No. PCT/GB2019/052991, dated Mar. 17, 2020.

(Continued)

*Primary Examiner* — Raul J Rios Russo

(57) ABSTRACT

A method may include measuring an electrical parameter of an electromagnetic load having a moving mass during the absence of a driving signal actively driving the electromagnetic load, measuring a mechanical parameter of mechanical motion of a host device comprising the electromagnetic load, correlating a relationship between the mechanical parameter and the electrical parameter, and calibrating the electromagnetic load across a plurality of mechanical motion conditions based on the relationship.

19 Claims, 3 Drawing Sheets

(56) References Cited

U.S. PATENT DOCUMENTS

| | | |
|---|---|---|
| 5,684,722 A | 11/1997 | Thorner et al. |
| 5,748,578 A | 5/1998 | Schell |
| 5,857,986 A | 1/1999 | Moriyasu |
| 6,050,393 A | 4/2000 | Murai et al. |
| 6,278,790 B1 | 8/2001 | Davis et al. |
| 6,294,891 B1 | 9/2001 | McConnell et al. |
| 6,332,029 B1 | 12/2001 | Azima et al. |
| 6,388,520 B2 | 5/2002 | Wada et al. |
| 6,567,478 B2 | 5/2003 | Oishi et al. |
| 6,580,796 B1 | 6/2003 | Kuroki |
| 6,683,437 B2 | 1/2004 | Tierling |
| 6,703,550 B2 | 3/2004 | Chu |
| 6,762,745 B1 | 7/2004 | Braun et al. |
| 6,768,779 B1 | 7/2004 | Nielsen |
| 6,784,740 B1 | 8/2004 | Tabatabaei |
| 6,906,697 B2 | 6/2005 | Rosenberg |
| 6,995,747 B2 | 2/2006 | Casebolt et al. |
| 7,042,286 B2 | 5/2006 | Meade et al. |
| 7,154,470 B2 | 12/2006 | Tierling |
| 7,277,678 B2 | 10/2007 | Rozenblit et al. |
| 7,333,604 B2 | 2/2008 | Zernovizky et al. |
| 7,392,066 B2 | 6/2008 | Hapamas |
| 7,456,688 B2 | 11/2008 | Okazaki et al. |
| 7,623,114 B2 | 11/2009 | Rank |
| 7,639,232 B2 | 12/2009 | Grant et al. |
| 7,777,566 B1 | 8/2010 | Drogi et al. |
| 7,791,588 B2 | 9/2010 | Tierling et al. |
| 7,825,838 B1 | 11/2010 | Srinivas et al. |
| 7,979,146 B2 | 7/2011 | Ullrich et al. |
| 3,068,025 A1 | 11/2011 | Devenyi et al. |
| 8,098,234 B2 | 1/2012 | Lacroix et al. |
| 8,102,364 B2 | 1/2012 | Tierling |
| 8,325,144 B1 | 12/2012 | Tierling et al. |
| 8,427,286 B2 | 4/2013 | Grant et al. |
| 8,441,444 B2 | 5/2013 | Moore et al. |
| 8,466,778 B2 | 6/2013 | Hwang et al. |
| 8,480,240 B2 | 7/2013 | Kashiyama |
| 8,572,293 B2 | 10/2013 | Cruz-Hernandez et al. |
| 8,572,296 B2 | 10/2013 | Shasha et al. |
| 8,593,269 B2 | 11/2013 | Grant et al. |
| 8,648,659 B2 | 2/2014 | Oh et al. |
| 8,648,829 B2 | 2/2014 | Shahoian et al. |
| 8,754,757 B1 | 6/2014 | Ullrich et al. |
| 8,754,758 B1 | 6/2014 | Ullrich et al. |
| 8,947,216 B2 | 2/2015 | Da Costa et al. |
| 8,981,915 B2 | 3/2015 | Birnbaum et al. |
| 8,994,518 B2 | 3/2015 | Gregorio et al. |
| 9,019,087 B2 | 4/2015 | Bakircioglu et al. |
| 9,030,428 B2 | 5/2015 | Fleming |
| 9,063,570 B2 | 6/2015 | Weddle et al. |
| 9,070,856 B1 | 6/2015 | Rose et al. |
| 9,083,821 B2 | 7/2015 | Hughes |
| 9,092,059 B2 | 7/2015 | Bhatia |
| 9,117,347 B2 | 8/2015 | Matthews |
| 9,128,523 B2 | 9/2015 | Buuck et al. |
| 9,164,587 B2 | 10/2015 | Da Costa et al. |
| 9,196,135 B2 | 11/2015 | Shah et al. |
| 9,248,840 B2 | 2/2016 | Truong |
| 9,326,066 B2 | 4/2016 | Klippel |
| 9,329,721 B1 | 5/2016 | Buuck et al. |
| 9,354,704 B2 | 5/2016 | Lacroix et al. |
| 9,368,005 B2 | 6/2016 | Cruz-Hernandez et al. |
| 9,489,047 B2 | 11/2016 | Jiang et al. |
| 9,495,013 B2 | 11/2016 | Underkoffler et al. |
| 9,507,423 B2 | 11/2016 | Gandhi et al. |
| 9,513,709 B2 | 12/2016 | Gregorio et al. |
| 9,520,036 B1 | 12/2016 | Buuck |
| 9,588,586 B2 | 3/2017 | Rihn |
| 9,640,047 B2 | 5/2017 | Choi et al. |
| 9,652,041 B2 | 5/2017 | Jiang et al. |
| 9,696,859 B1 | 7/2017 | Heller et al. |
| 9,697,450 B1 | 7/2017 | Lee |
| 9,715,300 B2 | 7/2017 | Sinclair et al. |
| 9,740,381 B1 | 8/2017 | Chaudhri et al. |
| 9,842,476 B2 | 12/2017 | Rihn et al. |
| 9,864,567 B2 | 1/2018 | Seo |
| 9,881,467 B2 | 1/2018 | Levesque |
| 9,886,829 B2 | 2/2018 | Levesque |
| 9,946,348 B2 | 4/2018 | Ullrich et al. |
| 9,947,186 B2 | 4/2018 | Macours |
| 9,959,744 B2 | 5/2018 | Koskan et al. |
| 9,965,092 B2 | 5/2018 | Smith |
| 10,032,550 B1 | 7/2018 | Zhang et al. |
| 10,039,080 B2 | 7/2018 | Miller et al. |
| 10,055,950 B2 | 8/2018 | Saboune et al. |
| 10,074,246 B2 | 9/2018 | Da Costa et al. |
| 10,102,722 B2 | 10/2018 | Levesque et al. |
| 10,110,152 B1 | 10/2018 | Hajati |
| 10,171,008 B2 | 1/2019 | Nishitani et al. |
| 10,175,763 B2 | 1/2019 | Shah |
| 10,191,579 B2 | 1/2019 | Forlines et al. |
| 10,264,348 B1 | 4/2019 | Harris et al. |
| 10,402,031 B2 | 9/2019 | Vandermeijden et al. |
| 10,447,217 B2 | 10/2019 | Zhao et al. |
| 10,564,727 B2 | 2/2020 | Billington et al. |
| 10,620,704 B2 | 4/2020 | Rand et al. |
| 10,667,051 B2 | 5/2020 | Stahl |
| 10,726,638 B2 | 7/2020 | Mondello et al. |
| 10,732,714 B2 | 8/2020 | Rao et al. |
| 10,735,956 B2 | 8/2020 | Bae et al. |
| 10,782,785 B2 | 9/2020 | Hu et al. |
| 10,795,443 B2 | 10/2020 | Hu et al. |
| 10,820,100 B2 | 10/2020 | Stahl et al. |
| 10,828,672 B2 | 11/2020 | Stahl et al. |
| 10,832,537 B2 | 11/2020 | Doy et al. |
| 10,848,886 B2 | 11/2020 | Rand |
| 10,860,202 B2 | 12/2020 | Sepehr et al. |
| 10,955,955 B2 | 3/2021 | Peso Parada et al. |
| 10,969,871 B2 | 4/2021 | Rand et al. |
| 10,976,825 B2 | 4/2021 | Das et al. |
| 11,069,206 B2 | 7/2021 | Rao et al. |
| 11,079,874 B2 | 8/2021 | Lapointe et al. |
| 11,139,767 B2 | 10/2021 | Janko et al. |
| 11,150,733 B2 | 10/2021 | Das et al. |
| 11,259,121 B2 | 2/2022 | Lindemann et al. |
| 11,460,526 B1 | 10/2022 | Foo et al. |
| 2001/0043714 A1 | 11/2001 | Asada et al. |
| 2002/0018578 A1 | 2/2002 | Burton |
| 2002/0085647 A1 | 7/2002 | Oishi et al. |
| 2003/0068053 A1 | 4/2003 | Chu |
| 2003/0214485 A1 | 11/2003 | Roberts |
| 2005/0031140 A1 | 2/2005 | Browning |
| 2005/0134562 A1 | 6/2005 | Grant et al. |
| 2005/0195919 A1 | 9/2005 | Cova |
| 2006/0028095 A1 | 2/2006 | Maruyama et al. |
| 2006/0197753 A1 | 9/2006 | Hotelling |
| 2006/0284856 A1 | 12/2006 | Soss |
| 2007/0013337 A1 | 1/2007 | Liu et al. |
| 2007/0024254 A1 | 2/2007 | Radecker et al. |
| 2007/0241816 A1 | 10/2007 | Okazaki et al. |
| 2008/0077367 A1 | 3/2008 | Odajima |
| 2008/0167832 A1 | 7/2008 | Soss |
| 2008/0226109 A1 | 9/2008 | Yamakata et al. |
| 2008/0240458 A1 | 10/2008 | Goldstein et al. |
| 2008/0293453 A1 | 11/2008 | Atlas et al. |
| 2008/0316181 A1 | 12/2008 | Nurmi |
| 2009/0020343 A1 | 1/2009 | Rothkopf et al. |
| 2009/0079690 A1 | 3/2009 | Watson et al. |
| 2009/0088220 A1 | 4/2009 | Persson |
| 2009/0096632 A1 | 4/2009 | Ullrich et al. |
| 2009/0102805 A1 | 4/2009 | Meijer et al. |
| 2009/0128306 A1 | 5/2009 | Luden et al. |
| 2009/0153499 A1 | 6/2009 | Kim et al. |
| 2009/0189867 A1 | 7/2009 | Krah et al. |
| 2009/0278819 A1 | 11/2009 | Goldenberg et al. |
| 2009/0313542 A1 | 12/2009 | Cruz-Hernandez et al. |
| 2010/0013761 A1 | 1/2010 | Birnbaum et al. |
| 2010/0080331 A1 | 4/2010 | Garudadri et al. |
| 2010/0085317 A1 | 4/2010 | Park et al. |
| 2010/0141408 A1 | 6/2010 | Doy et al. |
| 2010/0141606 A1 | 6/2010 | Bae et al. |
| 2010/0260371 A1 | 10/2010 | Afshar |
| 2010/0261526 A1 | 10/2010 | Anderson et al. |
| 2011/0056763 A1 | 3/2011 | Tanase et al. |

(56) References Cited

U.S. PATENT DOCUMENTS

| | | |
|---|---|---|
| 2011/0075835 A1 | 3/2011 | Hill |
| 2011/0077055 A1 | 3/2011 | Pakula et al. |
| 2011/0141052 A1 | 6/2011 | Bernstein et al. |
| 2011/0161537 A1 | 6/2011 | Chang |
| 2011/0163985 A1 | 7/2011 | Bae et al. |
| 2011/0167391 A1 | 7/2011 | Momeyer et al. |
| 2012/0011436 A1 | 1/2012 | Jinkinson et al. |
| 2012/0105358 A1 | 5/2012 | Momeyer et al. |
| 2012/0105367 A1 | 5/2012 | Son et al. |
| 2012/0112894 A1 | 5/2012 | Yang et al. |
| 2012/0206246 A1 | 8/2012 | Cruz-Hernandez et al. |
| 2012/0206247 A1 | 8/2012 | Bhatia et al. |
| 2012/0229264 A1 | 9/2012 | Company Bosch et al. |
| 2012/0249462 A1 | 10/2012 | Flanagan et al. |
| 2012/0253698 A1 | 10/2012 | Cokonaj |
| 2012/0306631 A1 | 12/2012 | Hughes |
| 2013/0016855 A1 | 1/2013 | Lee et al. |
| 2013/0027359 A1 | 1/2013 | Schevin et al. |
| 2013/0038792 A1 | 2/2013 | Quigley et al. |
| 2013/0096849 A1 | 4/2013 | Campbell et al. |
| 2013/0141382 A1 | 6/2013 | Simmons et al. |
| 2013/0275058 A1 | 10/2013 | Awad |
| 2013/0289994 A1 | 10/2013 | Newman et al. |
| 2013/0307786 A1 | 11/2013 | Heubel |
| 2014/0035736 A1 | 2/2014 | Weddle et al. |
| 2014/0056461 A1 | 2/2014 | Afshar |
| 2014/0064516 A1 | 3/2014 | Cruz-Hernandez et al. |
| 2014/0079248 A1 | 3/2014 | Short et al. |
| 2014/0085064 A1 | 3/2014 | Crawley et al. |
| 2014/0118125 A1 | 5/2014 | Bhatia |
| 2014/0118126 A1 | 5/2014 | Garg et al. |
| 2014/0119244 A1 | 5/2014 | Steer et al. |
| 2014/0125467 A1 | 5/2014 | Da Costa et al. |
| 2014/0139327 A1 | 5/2014 | Bau et al. |
| 2014/0176415 A1 | 6/2014 | Buuck et al. |
| 2014/0205260 A1 | 7/2014 | Lacroix et al. |
| 2014/0222377 A1 | 8/2014 | Bitan et al. |
| 2014/0226068 A1 | 8/2014 | Lacroix et al. |
| 2014/0253303 A1 | 9/2014 | Levesque |
| 2014/0292501 A1 | 10/2014 | Lim et al. |
| 2014/0300454 A1 | 10/2014 | Lacroix et al. |
| 2014/0340209 A1 | 11/2014 | Lacroix et al. |
| 2014/0347176 A1 | 11/2014 | Modarres et al. |
| 2015/0049882 A1 | 2/2015 | Chiu et al. |
| 2015/0061846 A1 | 3/2015 | Yliaho |
| 2015/0070149 A1 | 3/2015 | Cruz-Hernandez et al. |
| 2015/0070151 A1 | 3/2015 | Cruz-Hernandez et al. |
| 2015/0070154 A1 | 3/2015 | Levesque et al. |
| 2015/0070260 A1 | 3/2015 | Saboune et al. |
| 2015/0077324 A1 | 3/2015 | Birnbaum et al. |
| 2015/0084752 A1 | 3/2015 | Heubel et al. |
| 2015/0116205 A1 | 4/2015 | Westerman et al. |
| 2015/0130767 A1 | 5/2015 | Myers et al. |
| 2015/0208189 A1 | 7/2015 | Tsai |
| 2015/0216762 A1 | 8/2015 | Oohashi et al. |
| 2015/0234464 A1 | 8/2015 | Yliaho |
| 2015/0264455 A1 | 9/2015 | Granoto et al. |
| 2015/0268768 A1 | 9/2015 | Woodhull et al. |
| 2015/0324116 A1 | 11/2015 | Marsden et al. |
| 2015/0325116 A1 | 11/2015 | Umminger, III |
| 2015/0339898 A1 | 11/2015 | Saboune et al. |
| 2015/0341714 A1 | 11/2015 | Ahn et al. |
| 2015/0356981 A1 | 12/2015 | Johnson et al. |
| 2016/0004311 A1 | 1/2016 | Yliaho |
| 2016/0007095 A1 | 1/2016 | Lacroix |
| 2016/0063826 A1 | 3/2016 | Morrell et al. |
| 2016/0070392 A1 | 3/2016 | Wang et al. |
| 2016/0074278 A1 | 3/2016 | Muench et al. |
| 2016/0097662 A1 | 4/2016 | Chang et al. |
| 2016/0132118 A1 | 5/2016 | Park et al. |
| 2016/0162031 A1 | 6/2016 | Westerman et al. |
| 2016/0179203 A1 | 6/2016 | Modarres et al. |
| 2016/0187987 A1 | 6/2016 | Ulrich et al. |
| 2016/0239089 A1 | 8/2016 | Taninaka et al. |
| 2016/0246378 A1 | 8/2016 | Sampanes et al. |
| 2016/0277821 A1 | 9/2016 | Kunimoto |
| 2016/0291731 A1 | 10/2016 | Liu et al. |
| 2016/0328065 A1 | 11/2016 | Johnson et al. |
| 2016/0358605 A1 | 12/2016 | Ganong, III et al. |
| 2017/0052593 A1 | 2/2017 | Jiang et al. |
| 2017/0078804 A1 | 3/2017 | Guo et al. |
| 2017/0083096 A1 | 3/2017 | Rihn et al. |
| 2017/0090572 A1 | 3/2017 | Holenarsipur et al. |
| 2017/0090573 A1 | 3/2017 | Hajati et al. |
| 2017/0153760 A1 | 6/2017 | Chawda et al. |
| 2017/0168574 A1 | 6/2017 | Zhang |
| 2017/0168773 A1 | 6/2017 | Keller et al. |
| 2017/0169674 A1 | 6/2017 | Macours |
| 2017/0180863 A1 | 6/2017 | Biggs et al. |
| 2017/0220197 A1 | 8/2017 | Matsumoto et al. |
| 2017/0256145 A1 | 9/2017 | Macours et al. |
| 2017/0277350 A1 | 9/2017 | Wang et al. |
| 2017/0031495 A1 | 12/2017 | Tse |
| 2017/0357440 A1 | 12/2017 | Tse |
| 2018/0021811 A1 | 1/2018 | Kutej et al. |
| 2018/0033946 A1 | 2/2018 | Kemppinen et al. |
| 2018/0059733 A1 | 3/2018 | Gault et al. |
| 2018/0059793 A1 | 3/2018 | Hajati |
| 2018/0067557 A1 | 3/2018 | Robert et al. |
| 2018/0074637 A1 | 3/2018 | Rosenberg et al. |
| 2018/0082673 A1 | 3/2018 | Tzanetos |
| 2018/0084362 A1 | 3/2018 | Zhang et al. |
| 2018/0095596 A1 | 4/2018 | Turgeman |
| 2018/0151036 A1 | 5/2018 | Cha et al. |
| 2018/0158289 A1 | 6/2018 | Vasilev et al. |
| 2018/0159452 A1 | 6/2018 | Eke et al. |
| 2018/0159457 A1 | 6/2018 | Eke |
| 2018/0159545 A1 | 6/2018 | Eke et al. |
| 2018/0160227 A1 | 6/2018 | Lawrence et al. |
| 2018/0165925 A1 | 6/2018 | Israr et al. |
| 2018/0178114 A1 | 6/2018 | Mizuta et al. |
| 2018/0182212 A1 | 6/2018 | Li et al. |
| 2018/0183372 A1 | 6/2018 | Li et al. |
| 2018/0194369 A1 | 7/2018 | Lisseman et al. |
| 2018/0196567 A1 | 7/2018 | Klein et al. |
| 2018/0224963 A1 | 8/2018 | Lee et al. |
| 2018/0227063 A1 | 8/2018 | Heubel et al. |
| 2018/0237033 A1 | 8/2018 | Hakeem et al. |
| 2018/0206282 A1 | 9/2018 | Singh |
| 2018/0253123 A1 | 9/2018 | Levesque et al. |
| 2018/0255411 A1 | 9/2018 | Lin et al. |
| 2018/0267897 A1 | 9/2018 | Jeong |
| 2018/0294757 A1 | 10/2018 | Feng et al. |
| 2018/0301060 A1 | 10/2018 | Israr et al. |
| 2018/0304310 A1* | 10/2018 | Long .................... G06F 3/016 |
| 2018/0321056 A1 | 11/2018 | Yoo et al. |
| 2018/0321748 A1 | 11/2018 | Rao et al. |
| 2018/0323725 A1 | 11/2018 | Cox et al. |
| 2018/0329172 A1 | 11/2018 | Tabuchi |
| 2018/0335848 A1 | 11/2018 | Moussette et al. |
| 2018/0367897 A1 | 12/2018 | Bjork et al. |
| 2019/0020760 A1 | 1/2019 | DeBates et al. |
| 2019/0035235 A1 | 1/2019 | Da Costa et al. |
| 2019/0227628 A1 | 1/2019 | Rand et al. |
| 2019/0044651 A1 | 2/2019 | Nakada |
| 2019/0051229 A1 | 2/2019 | Ozguner et al. |
| 2019/0064925 A1 | 2/2019 | Kim et al. |
| 2019/0069088 A1 | 2/2019 | Seiler |
| 2019/0073078 A1 | 3/2019 | Sheng et al. |
| 2019/0102031 A1 | 4/2019 | Shutzberg et al. |
| 2019/0103829 A1 | 4/2019 | Vasudevan et al. |
| 2019/0138098 A1 | 5/2019 | Shah |
| 2019/0163234 A1 | 5/2019 | Kim et al. |
| 2019/0196596 A1 | 6/2019 | Yokoyama et al. |
| 2019/0206396 A1 | 7/2019 | Chen |
| 2019/0215349 A1 | 7/2019 | Adams et al. |
| 2019/0220095 A1 | 7/2019 | Ogita et al. |
| 2019/0228619 A1 | 7/2019 | Yokoyama et al. |
| 2019/0114496 A1 | 8/2019 | Lesso |
| 2019/0235629 A1 | 8/2019 | Hu et al. |
| 2019/0253031 A1 | 8/2019 | Vellanki et al. |
| 2019/0294247 A1 | 9/2019 | Hu et al. |
| 2019/0296674 A1 | 9/2019 | Janko et al. |
| 2019/0297418 A1 | 9/2019 | Stahl |

(56) References Cited

U.S. PATENT DOCUMENTS

| | | | |
|---|---|---|---|
| 2019/0305851 A1 | 10/2019 | Vegas-Olmos et al. | |
| 2019/0311590 A1 | 10/2019 | Doy et al. | |
| 2019/0341903 A1 | 11/2019 | Kim | |
| 2019/0384393 A1 | 12/2019 | Cruz-Hernandez et al. | |
| 2019/0384898 A1 | 12/2019 | Chen et al. | |
| 2020/0117506 A1 | 4/2020 | Chan | |
| 2020/0139403 A1* | 5/2020 | Palit | G05D 19/02 |
| 2020/0150767 A1 | 5/2020 | Karimi Eskandary et al. | |
| 2020/0218352 A1 | 7/2020 | Macours et al. | |
| 2020/0231085 A1 | 7/2020 | Kunii et al. | |
| 2020/0306796 A1 | 10/2020 | Lindemann et al. | |
| 2020/0313529 A1 | 10/2020 | Lindemann et al. | |
| 2020/0313654 A1* | 10/2020 | Marchais | H03H 17/06 |
| 2020/0314969 A1* | 10/2020 | Marchais | G08B 6/00 |
| 2020/0348249 A1 | 11/2020 | Marchais et al. | |
| 2020/0401292 A1 | 12/2020 | Lorenz et al. | |
| 2020/0403546 A1* | 12/2020 | Janko | H02P 25/034 |
| 2021/0108975 A1 | 4/2021 | Peso Parada et al. | |
| 2021/0125469 A1 | 4/2021 | Alderson | |
| 2021/0153562 A1 | 5/2021 | Fishwick et al. | |
| 2021/0157436 A1 | 5/2021 | Peso Parada et al. | |
| 2021/0174777 A1* | 6/2021 | Marchais | G01R 27/02 |
| 2021/0175869 A1 | 6/2021 | Taipale | |
| 2021/0200316 A1 | 7/2021 | Das et al. | |
| 2021/0325967 A1 | 10/2021 | Khenkin et al. | |
| 2021/0328535 A1* | 10/2021 | Khenkin | H02P 25/034 |
| 2021/0365118 A1 | 11/2021 | Rajapurkar et al. | |
| 2022/0026989 A1 | 1/2022 | Rao et al. | |

FOREIGN PATENT DOCUMENTS

| | | |
|---|---|---|
| CN | 103403796 A | 11/2013 |
| CN | 104811838 A | 7/2015 |
| CN | 204903757 U | 12/2015 |
| CN | 105264551 A | 1/2016 |
| CN | 106438890 A | 2/2017 |
| CN | 106950832 A | 7/2017 |
| CN | 107665051 A | 2/2018 |
| CN | 107835968 A | 3/2018 |
| CN | 210628147 U | 5/2020 |
| CN | 114237414 A | 3/2022 |
| EP | 0784844 B1 | 6/2005 |
| EP | 2306269 A1 | 4/2011 |
| EP | 2363785 A1 | 9/2011 |
| EP | 2487780 A1 | 8/2012 |
| EP | 2600225 A1 | 6/2013 |
| EP | 2846218 A1 | 3/2015 |
| EP | 2846229 A2 | 3/2015 |
| EP | 2846329 A1 | 3/2015 |
| EP | 2988528 A1 | 2/2016 |
| EP | 3125508 A1 | 2/2017 |
| EP | 3379382 A1 | 9/2018 |
| GB | 201620746 A | 1/2017 |
| IN | 201747044027 | 8/2018 |
| JP | H02130433 B2 | 5/1990 |
| JP | H08149006 A | 6/1996 |
| JP | H10184782 A | 7/1998 |
| JP | 6026751 B2 | 11/2016 |
| JP | 6250985 | 12/2017 |
| JP | 6321351 | 5/2018 |
| KR | 20120126446 A | 11/2012 |
| WO | 2013104919 A1 | 7/2013 |
| WO | 2013186845 A1 | 12/2013 |
| WO | 2014018086 A1 | 1/2014 |
| WO | 2014094283 A1 | 6/2014 |
| WO | 2016105496 A1 | 6/2016 |
| WO | 2016164193 A1 | 10/2016 |
| WO | 2017034973 A1 | 3/2017 |
| WO | 2017113651 A1 | 7/2017 |
| WO | 2018053159 A1 | 3/2018 |
| WO | 2018067613 A1 | 4/2018 |
| WO | 2018125347 A1 | 7/2018 |
| WO | 2020004840 A1 | 1/2020 |
| WO | 2020055405 A1 | 3/2020 |

OTHER PUBLICATIONS

International Search Report and Written Opinion of the International Searching Authority, International Application No. PCT/GB2020/050823, dated Jun. 30, 2020.

International Search Report and Written Opinion of the International Searching Authority, International Application No. PCT/GB2020/051037, dated Jul. 9, 2020.

Communication Relating to the Results of the Partial International Search, and Provisional Opinion Accompanying the Partial Search Result, of the International Searching Authority, International Application No. PCT/GB2020/050822, dated Jul. 9, 2020.

International Search Report and Written Opinion of the International Searching Authority, International Application No. PCT/GB2020/051035, dated Jul. 10, 2020.

Office Action of the Intellectual Property Office, ROC (Taiwan) Patent Application No. 107115475, dated Apr. 30, 2021.

First Office Action, China National Intellectual Property Administration, Patent Application No. 2019800208570, dated Jun. 3, 2021.

International Search Report and Written Opinion of the International Searching Authority, International Application No. PCT/US2021/021908, dated Jun. 9, 2021.

Notice of Preliminary Rejection, Korean Intellectual Property Office, Application No. 10-2019-7036236, dated Jun. 29, 2021.

Combined Search and Examination Report, United Kingdom Intellectual Property Office, Application No. GB2018051.9, dated Jun. 30, 2021.

Communication pursuant to Rule 164(2)(b) and Article 94(3) EPC, European Patent Office, Application No. 18727512.8, dated Jul. 8, 2021.

Gottfried Behler: "Measuring the Loudspeaker's Impedance during Operation for the Derivation of the Voice Coil Temperature", AES Convention Preprint, Feb. 25, 1995 (Feb. 25, 1995), Paris.

First Office Action, China National Intellectual Property Administration, Patent Application No. 2019800211287, dated Jul. 5, 2021.

International Search Report and Written Opinion of the International Searching Authority, International Application No. PCT/US2020/024864, dated Jul. 6, 2020.

International Search Report and Written Opinion of the International Searching Authority, International Application No. PCT/GB2020/050822, dated Aug. 31, 2020.

International Search Report and Written Opinion of the International Searching Authority, International Application No. PCT/GB2020/051438, dated Sep. 28, 2020.

Invitation to Pay Additional Fees, Partial International Search Report and Provisional Opinion of the International Searching Authority, International Application No. PCT/US2020/052537, dated Jan. 14, 2021.

International Search Report and Written Opinion of the International Searching Authority, International Application No. PCT/US2020/056610, dated Jan. 21, 2021.

International Search Report and Written Opinion of the International Searching Authority, International Application No. PCT/GB2020/052537, dated Mar. 9, 2021.

First Examination Opinion Notice, State Intellectual Property Office of the People's Republic of China, Application No. 201880037435.X, dated Dec. 31, 2020.

Steinbach et al., Haptic Data Compression and Communication, IEEE Signal Processing Magazine, Jan. 2011.

Pezent et al., Syntacts Open-Source Software and Hardware for Audio-Controlled Haptics, IEEE Transactions on Haptics, vol. 14, No. 1, Jan.-Mar. 2021.

Danieau et al., Enhancing Audiovisual Experience with Haptic Feedback: A Survey on HAV, IEEE Transactions on Haptics, vol. 6, No. 2, Apr.-Jun. 2013.

Danieau et al., Toward Haptic Cinematography: Enhancing Movie Experiences with Camera-Based Haptic Effects, IEEE Computer Society, IEEE MultiMedia, Apr.-Jun. 2014.

Jaijongrak et al., A Haptic and Auditory Assistive User Interface: Helping the Blinds on their Computer Operations, 2011 IEEE International Conference on Rehabilitation Robotics, Rehab Week Zurich, ETH Zurich Science City, Switzerland, Jun. 29-Jul. 1, 2011.

(56) References Cited

OTHER PUBLICATIONS

Lim et al., An Audio-Haptic Feedbacks for Enhancing User Experience in Mobile Devices, 2013 IEEE International Conference on Consumer Electronics (ICCE).
Weddle et al., How Does Audio-Haptic Enhancement Influence Emotional Response to Mobile Media, 2013 Fifth International Workshop on Quality of Multimedia Experience (QoMEX), QMEX 2013.
Final Notice of Preliminary Rejection, Korean Patent Office, Application No. 10-2019-7036236, dated Nov. 29, 2021.
Examination Report, United Kingdom Intellectual Property Office, Application No. GB2018051.9, dated Nov. 5, 2021.
Examination Report under Section 18(3), United Kingdom Intellectual Property Office, Application No. GB2106247.6, dated Mar. 31, 2022.
International Search Report and Written Opinion of the International Searching Authority, International Application No. PCT/GB2019/050964, dated Sep. 3, 2019.
International Search Report and Written Opinion of the International Searching Authority, International Application No. PCT/GB2019/050770, dated Jul. 5, 2019.
Communication Relating to the Results of the Partial International Search, and Provisional Opinion Accompanying the Partial Search Result, of the International Searching Authority, International Application No. PCT/US2018/031329, dated Jul. 20, 2018.
Combined Search and Examination Report, UKIPO, Application No. GB1720424.9, dated Jun. 5, 2018.
Examination Report under Section 18(3), United Kingdom Intellectual Property Office, Application No. GB2018050.1, dated Dec. 22, 2021.
Second Office Action, National Intellectual Property Administration, PRC, Application No. 2019800208570, dated Jan. 19, 2022.
Combined Search and Examination Report under Sections 17 and 18(3), UKIPO, Application No. GB2210174.5, dated Aug. 1, 2022.
Examination Report under Sections 17 and 18(3), UKIPO, Application No. GB2112207.2, dated Aug. 18, 2022.
International Search Report and Written Opinion of the International Searching Authority, International Application No. PCT/US2022/030541, dated Sep. 1, 2022.
Vanderborght, B. et al., Variable impedance actuators: A review; Robotics and Autonomous Systems 61, Aug. 6, 2013, pp. 1601-1614.
International Search Report and Written Opinion of the International Searching Authority, International Application No. PCT/US2022/033190, dated Sep. 8, 2022.
International Search Report and Written Opinion of the International Searching Authority, International Application No. PCT/US2022/033230, dated Sep. 15, 2022.
Communication pursuant to Article 94(3), EPC, European Patent Office, Application No. 18727512.8, dated Sep. 26, 2022.
Examination Report under Section 18(3), UKIPO, Application No. GB2112207.2, dated Nov. 7, 2022.
Examination Report, Intellectual Property India, Application No. 202117019138, dated Jan. 4, 2023.
Examination Report under Section 18(3), UKIPO, Application No. GB2113228.7, dated Feb. 10, 2023.
Examination Report under Section 18(3), UKIPO, Application No. GB2113154.5, dated Feb. 17, 2023.
Search Report, China National Intellectual Property Administration, Application No. 2019107179621, dated Jan. 11, 2023.
First Office Action, China National Intellectual Property Administration, Application No. 2019107179621, dated Jan. 19, 2023.

\* cited by examiner

IN-SITU MONITORING, CALIBRATION, AND TESTING OF A HAPTIC ACTUATOR

FIELD OF DISCLOSURE

The present disclosure relates in general to in-situ monitoring, calibration, and testing of an electromagnetic transducer, such as a haptic actuator.

BACKGROUND

Vibro-haptic transducers, for example linear resonant actuators (LRAs), are widely used in portable devices such as mobile phones to generate vibrational feedback to a user. Vibro-haptic feedback in various forms creates different feelings of touch to a user's skin, and may play increasing roles in human-machine interactions for modern devices.

An LRA may be modelled as a mass-spring electromechanical vibration system. When driven with appropriately designed or controlled driving signals, an LRA may generate certain desired forms of vibrations. For example, a sharp and clear-cut vibration pattern on a user's finger may be used to create a sensation that mimics a mechanical button click. This clear-cut vibration may then be used as a virtual switch to replace mechanical buttons.

FIG. 1 illustrates an example of a vibro-haptic system in a device 100. Device 100 may comprise a controller 101 configured to control a signal applied to an amplifier 102. Amplifier 102 may then drive a vibrational actuator (e.g., haptic transducer) 103 based on the signal. Controller 101 may be triggered by a trigger to output to the signal. The trigger may for example comprise a pressure or force sensor on a screen or virtual button of device 100.

Among the various forms of vibro-haptic feedback, tonal vibrations of sustained duration may play an important role to notify the user of the device of certain predefined events, such as incoming calls or messages, emergency alerts, and timer warnings, etc. In order to generate tonal vibration notifications efficiently, it may be desirable to operate the haptic actuator at its resonance frequency.

The resonance frequency $f_0$ of a haptic transducer may be approximately estimated as:

$$f_0 = \frac{1}{2\pi\sqrt{CM}} \quad (1)$$

where C is the compliance of the spring system, and M is the equivalent moving mass, which may be determined based on both the actual moving part in the haptic transducer and the mass of the portable device holding the haptic transducer.

Due to sample-to-sample variations in individual haptic transducers, mobile device assembly variations, temporal component changes caused by aging, and use conditions such as various different strengths of a user gripping of the device, the vibration resonance of the haptic transducer may vary from time to time.

FIG. 2 illustrates an example of a linear resonant actuator (LRA) modelled as a linear system. LRAs are non-linear components that may behave differently depending on, for example, the voltage levels applied, the operating temperature, and the frequency of operation. However, these components may be modelled as linear components within certain conditions. In this example, the LRA is modelled as a third order system having electrical and mechanical elements. In particular, Re and Le are the DC resistance and coil inductance of the coil-magnet system, respectively; and Bl is the magnetic force factor of the coil. The driving amplifier outputs the voltage waveform V(t) with the output impedance Ro. The terminal voltage $V_T(t)$ may be sensed across the terminals of the haptic transducer. The mass-spring system 201 moves with velocity u(t).

A haptic system may require precise control of movements of the haptic transducer. Such control may rely on the magnetic force factor Bl, which may also be known as the electromagnetic transfer function of the haptic transducer. In an ideal case, magnetic force factor Bl can be given by the product B·l, where B is magnetic flux density and l is a total length of electrical conductor within a magnetic field. Both magnetic flux density B and length l should remain constant in an ideal case with motion occurring along a single axis. However, such idealized case does not often represent real-world devices.

Instead, magnetic force factor Bl for a haptic transducer is typically nonlinear, non-stationary, temperature-dependent, and has off-axis components of motion that may cause movement in undesired directions and reduce power transfer efficiency of the haptic transducer. The non-idealities may negatively affect haptic transducer performance, which may in turn translate into unsatisfactory customer experience.

SUMMARY

In accordance with the teachings of the present disclosure, the disadvantages and problems associated with existing approaches for characterizing non-idealities of an electromagnetic transducer may be reduced or eliminated.

In accordance with embodiments of the present disclosure, a method may include measuring an electrical parameter of an electromagnetic load having a moving mass during the absence of a driving signal actively driving the electromagnetic load, measuring a mechanical parameter of mechanical motion of a host device comprising the electromagnetic load, correlating a relationship between the mechanical parameter and the electrical parameter, and calibrating the electromagnetic load across a plurality of mechanical motion conditions based on the relationship.

In accordance with these and other embodiments of the present disclosure, a system may include a first input for measuring an electrical parameter of an electromagnetic load having a moving mass during the absence of a driving signal actively driving the electromagnetic load, a second input for measuring a mechanical parameter of mechanical motion of a host device comprising the electromagnetic load, and a processing subsystem configured to correlate a relationship between the mechanical parameter and the electrical parameter and calibrate the electromagnetic load across a plurality of mechanical motion conditions based on the relationship.

In accordance with these and other embodiments of the present disclosure, a host device may include an electromagnetic load and a processing subsystem configured to measure an electrical parameter of an electromagnetic load having a moving mass during the absence of a driving signal actively driving the electromagnetic load, measure a mechanical parameter of mechanical motion of a host device comprising the electromagnetic load, correlate a relationship between the mechanical parameter and the electrical parameter, and calibrate the electromagnetic load across a plurality of mechanical motion conditions based on the relationship.

Technical advantages of the present disclosure may be readily apparent to one having ordinary skill in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

The description below sets forth example embodiments according to this disclosure. Further example embodiments and implementations will be apparent to those having ordinary skill in the art. Further, those having ordinary skill in the art will recognize that various equivalent techniques may be applied in lieu of, or in conjunction with, the embodiment discussed below, and all such equivalents should be deemed as being encompassed by the present disclosure.

Various electronic devices or smart devices may have transducers, speakers, and acoustic output transducers, for example any transducer for converting a suitable electrical driving signal into an acoustic output such as a sonic pressure wave or mechanical vibration. For example, many electronic devices may include one or more speakers or loudspeakers for sound generation, for example, for playback of audio content, voice communications and/or for providing audible notifications.

Such speakers or loudspeakers may comprise an electromagnetic actuator, for example a voice coil motor, which is mechanically coupled to a flexible diaphragm, for example a conventional loudspeaker cone, or which is mechanically coupled to a surface of a device, for example the glass screen of a mobile device. Some electronic devices may also include acoustic output transducers capable of generating ultrasonic waves, for example for use in proximity detection type applications and/or machine-to-machine communication.

Many electronic devices may additionally or alternatively include more specialized acoustic output transducers, for example, haptic transducers, tailored for generating vibrations for haptic control feedback or notifications to a user. Additionally or alternatively, an electronic device may have a connector, e.g., a socket, for making a removable mating connection with a corresponding connector of an accessory apparatus, and may be arranged to provide a driving signal to the connector so as to drive a transducer, of one or more of the types mentioned above, of the accessory apparatus when connected. Such an electronic device will thus comprise driving circuitry for driving the transducer of the host device or connected accessory with a suitable driving signal. For acoustic or haptic transducers, the driving signal may generally be an analog time varying voltage signal, for example, a time varying waveform.

Figure 3:
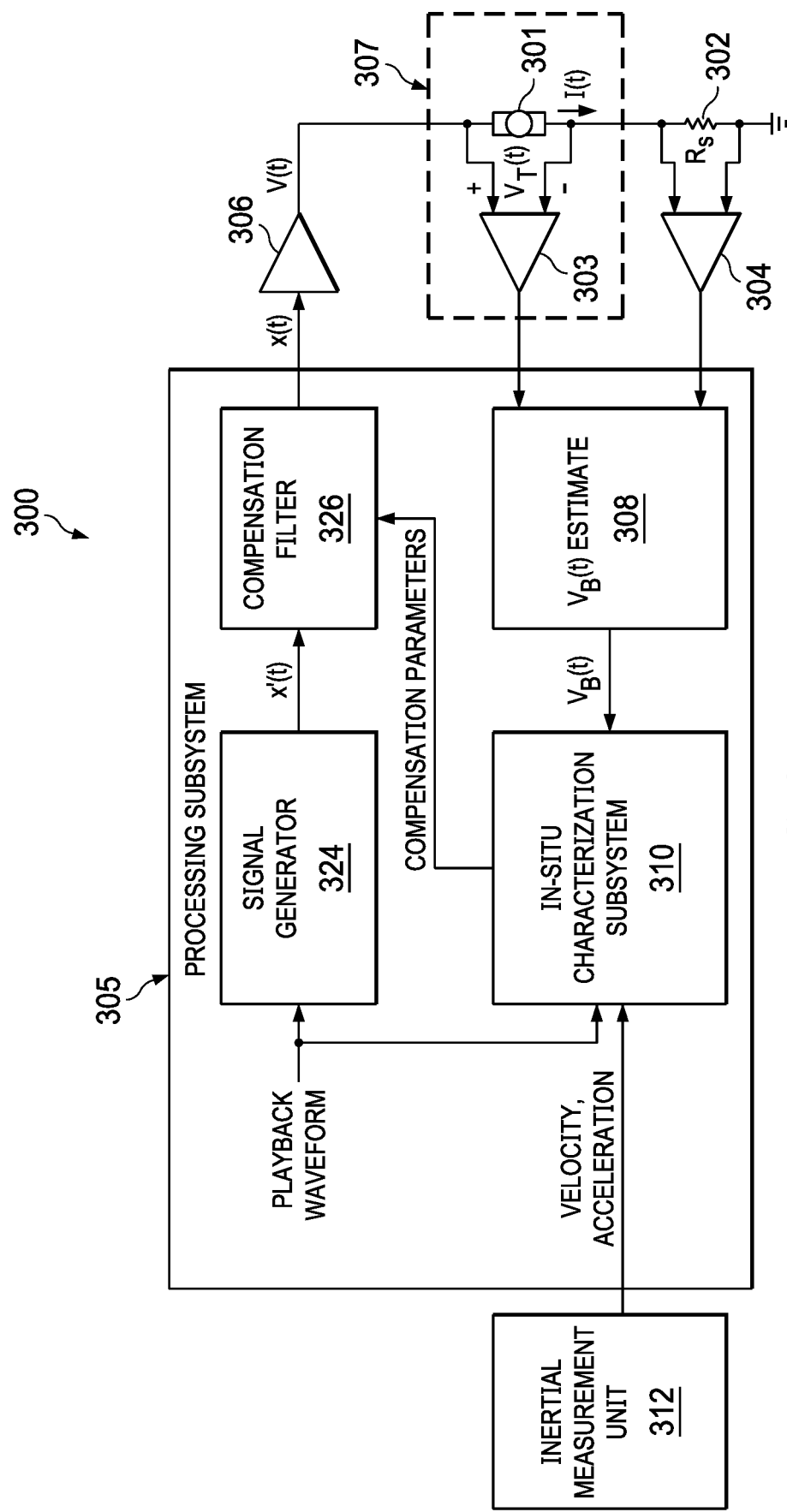
FIG. 3 illustrates selected components of an example host device incorporating force sensing using an electromagnetic load of the host device, in accordance with embodiments of the present disclosure.

FIG. 3 illustrates selected components of an example host device 300 incorporating force sensing using an electromagnetic load 301 of host device 300, in accordance with embodiments of the present disclosure. Host device 300 may include, without limitation, a mobile device, home application, a vehicle, and/or any other system, device, or apparatus that includes a human-machine interface. Electromagnetic load 301 may include any suitable load with a complex impedance, including without limitation a haptic transducer, a loudspeaker, a microspeaker, a piezoelectric transducer, or other suitable transducer.

In operation, a signal generator 324 of a processing subsystem 305 of host device 300 may generate a raw transducer driving signal x'(t) (which, in some embodiments, may be a waveform signal, such as a haptic waveform signal or audio signal). Raw transducer driving signal x'(t) may be generated based on a desired playback waveform received by signal generator 324.

Raw transducer driving signal x'(t) may be received by compensation filter 326 which, as described in greater detail below, may be applied to raw transducer driving signal x'(t) to compensate for non-idealities of electromagnetic load 301 in order to generate compensated transducer driving signal x(t).

Compensated transducer driving signal x(t) may in turn be amplified by amplifier 306 to generate a driving signal V(t) for driving electromagnetic load 301. Responsive to driving signal V(t), a sensed terminal voltage $V_T(t)$ of electromagnetic load 301 may be converted to a digital representation by a first analog-to-digital converter (ADC) 303. Similarly, sensed current I(t) may be converted to a digital representation by a second ADC 304. Current I(t) may be sensed across a shunt resistor 302 having resistance $R_s$ coupled to a terminal of electromagnetic load 301. The terminal voltage $V_T(t)$ may be sensed by a terminal voltage sensing block 307, for example a volt-meter.

Figure 1:
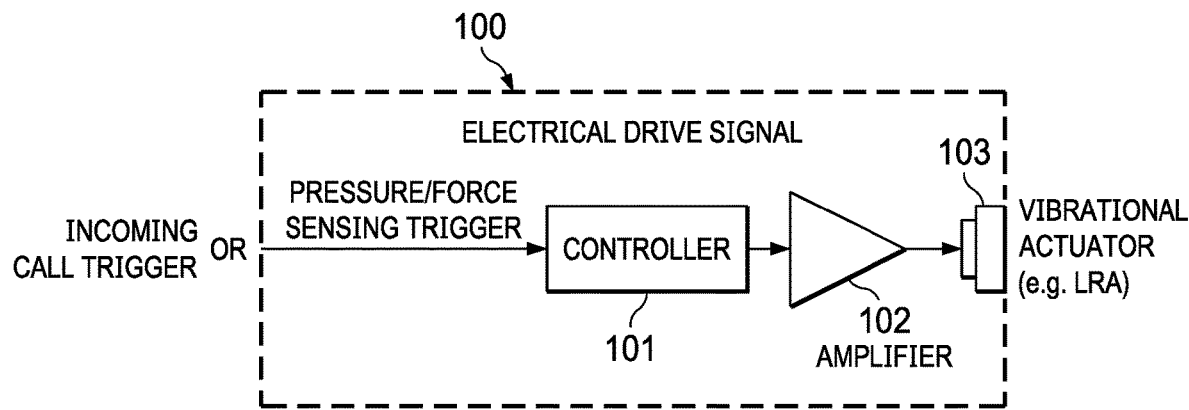
FIG. 1 illustrates an example of a vibro-haptic system in a device, as is known in the art.
Figure 2:
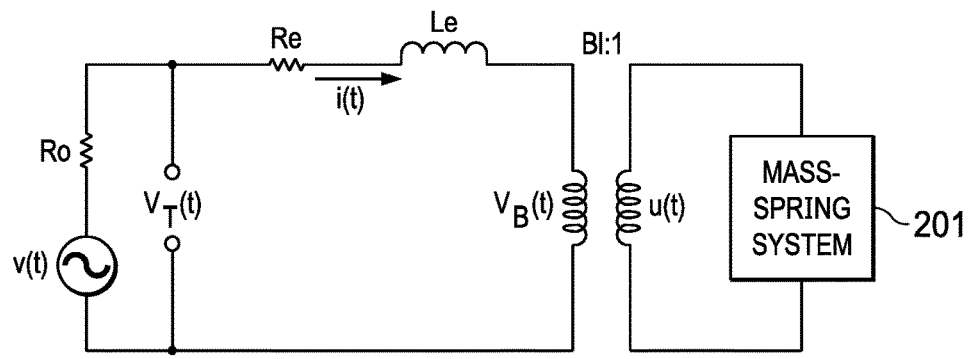
FIG. 2 illustrates an example of a Linear Resonant Actuator (LRA) modelled as a linear system, as is known in the art.

As shown in FIG. 3, processing subsystem 305 may include a back-EMF estimate block 308 that may estimate back-EMF voltage $V_B(t)$. In general, back-EMF voltage $V_B(t)$ may not be directly measured from outside of the haptic transducer. However, the terminal voltage $V_T(t)$ measured at the terminals of the haptic transducer may be related to $V_B(t)$ by:

$$V_T(t) = V_B(t) + Re \cdot I(t) + Le \cdot \frac{dI(t)}{dt} \quad (2)$$

where the parameters are defined as described with reference to FIG. 2. Consequently, back-EMF voltage $V_B(t)$ may be estimated according to equation (2) which may be rearranged as:

$$V_B(t) = V_T(t) - Re \cdot I(t) - Le \frac{dI(t)}{dt} \quad (3)$$

Because back-EMF voltage $V_B(t)$ may be proportional to velocity of the moving mass of electromagnetic load 301, back-EMF voltage $V_B(t)$ may in turn provide an estimate of such velocity.

In some embodiments, back-EMF estimate block 308 may be implemented as a digital filter with a proportional and parallel difference path. The estimates of DC resistance Re and inductance Le may not need to be accurate (e.g., within an approximate 10% error may be acceptable), and thus, fixed values from an offline calibration or from a data sheet specification may be sufficient. As an example, in some embodiments, back-EMF estimate block 308 may determine estimated back-EMF voltage $V_B(t)$ in accordance with the teachings of U.S. patent application Ser. No. 16/559,238, filed Sep. 3, 2019, which is incorporated by reference herein in its entirety.

Based on such estimated back-EMF voltage $V_B(t)$ and measurements of velocity and/or acceleration from an inertial measurement unit 312, an in-situ characterization subsystem 310 may, as described in greater detail below, calculate and store empirical measurements for magnetic force factor Bl, which in turn may be used to generate compensation parameters for controlling a response of compensation filter 326.

Inertial measurement unit 312 may comprise any suitable system, device, or apparatus configured to sense one or parameters related to motion of host device 300, for example velocity and/or acceleration, and generate one or more signals indicative of such one or more measured parameters. For example, inertial measurement unit 312 may include one or more accelerometers, gyroscopes, and magnetometers. In some embodiments, inertial measurement unit 312 may include six axes of measurement, thus allowing for sensing of velocity, acceleration, or other parameters related to motion of host device 300.

The relationship among estimated back-EMF voltage $V_B(t)$, magnetic force factor Bl, and an estimated velocity u(t) of a moving mass of electromagnetic load 301 may be determined from the relationship:

$$V_B(t) = Bl \cdot u(t)$$

Thus, in the absence of a playback waveform received by signal generator 324, when host device 300 is moved (e.g., by an end user thereof), inertial measurement unit 312 may measure velocity u(t). Accordingly, by knowing measured velocity u(t) and estimated back-EMF voltage $V_B(t)$, in-situ characterization subsystem 310 may allow for calculation of magnetic force factor Bl specific to the observed velocity. For example, if estimated back-EMF voltage $V_B(t)$ is measured to be 80 millivolts at a velocity of 0.1 meters per second of the moving mass of electromagnetic load 301, then in-situ characterization subsystem 310 may determine a magnetic force factor Bl equal to 0.8 Tesla-meters for electromagnetic load 301 at a velocity of 0.1 meters per second.

It is noted that this calculation relies on treating host device 300 as a high-impedance velocity source to the mass-spring system of electromagnetic load 301. Such convention may be known in the art as "supercompliance" and the use of such convention herein may be justified where a high ratio exists between the mass of host device 300 to the mass of the moving mass of electromagnetic load 301. In addition or alternatively, host device 300 may be driven by an external velocity source capable of producing the force necessary to achieve a velocity to the mass-spring system of electromagnetic load 301.

Over time during its operation, in-situ characterization subsystem 310 may create a library of magnetic force factor Bl measurements at various velocities, providing a complete operational space of magnetic force factor Bl in three dimensions of velocity space. Accordingly, in-situ characterization subsystem 310 may, based on the characterization of magnetic force factor Bl at various velocities, generate and communicate to compensation filter 326 one or more control signals in the form of compensation parameters in order to control a response of compensation filter 326 to compensate for non-idealities of electromagnetic load 301, including non-linearity and other non-idealities of magnetic force factor Bl.

Such continuous collection of data may also enable in-situ characterization subsystem 310 to perform diagnostics based on changes in magnetic force factor Bl over time. For example, threshold values for changes in magnetic force factor Bl over time may be used to trigger alerts to an end user and/or other remedial actions.

In some embodiments, in-situ characterization subsystem 310 may perform its functionality during normal use of host device 300 by an end user, which may be referred to as real-time or field calibration, in which the end user (e.g., intentionally or incidentally) supplies the motion to host device 300. In these and other embodiments, in-situ characterization subsystem 310 may perform its functionality during post-production calibration, in which motion may be controlled by a mechanical exciter of a test/calibration system.

Figure 4:
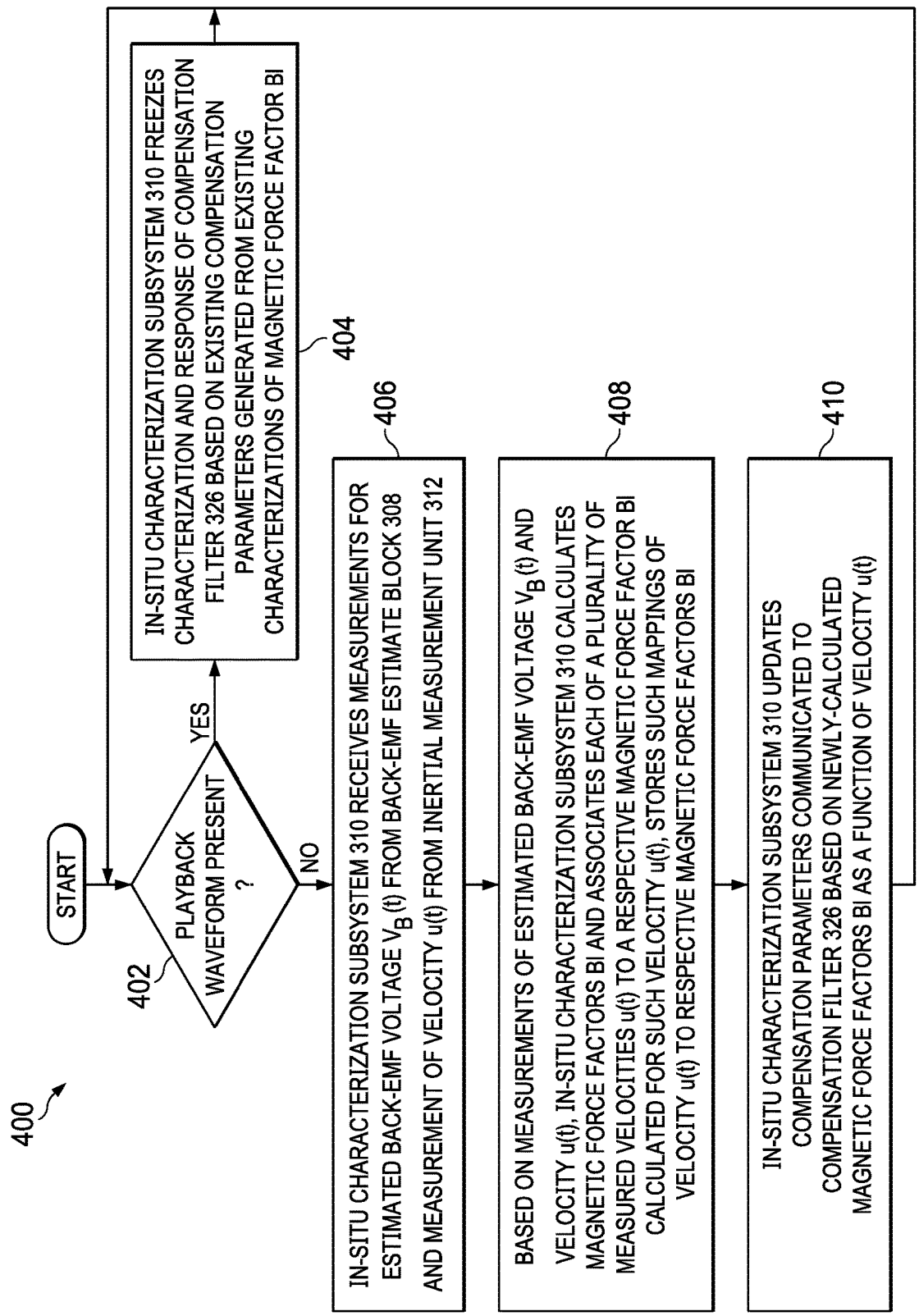
FIG. 4 illustrates a flow chart of an example method for in-situ monitoring, calibration, and testing of an electromagnetic transducer, in accordance with embodiments of the present disclosure.

FIG. 4 illustrates a flow chart of an example method 400 for in-situ monitoring, calibration, and testing of an electromagnetic transducer, in accordance with embodiments of the present disclosure. According to some embodiments, method 400 may begin at step 402. As noted above, teachings of the present disclosure may be implemented in a variety of configurations of host device 300. As such, the preferred initialization point for method 400 and the order of the steps comprising method 400 may depend on the implementation chosen.

At step 402, in-situ characterization subsystem 310 may determine if a playback waveform is being input to signal generator 324. If a playback waveform is being input to signal generator 324, method 400 may proceed to step 404. Otherwise, method 400 may proceed to step 406.

At step 404, responsive to determining that a playback waveform is being input to signal generator 324, in-situ characterization subsystem 310 may freeze characterization and the response of compensation filter 326 may be based on existing compensation parameters generated from existing characterizations of magnetic force factor Bl. After completion of step 404, method 400 may return again to step 402.

At step 406, responsive to an absence of a playback waveform being input to signal generator 324, in-situ characterization subsystem 310 may receive measurements for estimated back-EMF voltage $V_B(t)$ from back-EMF estimate block 308 and one or more measured parameters related to motion of host device 300 from inertial measurement unit 312, including velocity u(t).

At step 408, in-situ characterization subsystem 310 may, based on measurements of estimated back-EMF voltage $V_B(t)$ and velocity u(t), calculate associated magnetic force factors Bl and associate each of a plurality of measured velocities u(t) to a respective magnetic force factor Bl calculated for each velocity u(t), and store such mappings of velocities u(t) to respective magnetic force factors Bl (e.g., in computer-readable media integral to host device 300 and accessible by in-situ characterization subsystem 310).

At step 410, in-situ characterization subsystem 310 may update compensation parameters communicated to compensation filter 326 based on newly calculated magnetic force factors Bl as a function of velocity u(t). After completion of step 410, method 400 may proceed again to step 402.

Although FIG. 4 discloses a particular number of steps to be taken with respect to method 400, method 400 may be executed with greater or fewer steps than those depicted in FIG. 4. In addition, although FIG. 4 discloses a certain order of steps to be taken with respect to method 400, the steps comprising method 400 may be completed in any suitable order.

Method 400 may be implemented in whole or part using host device 300 and/or any other system operable to implement method 400. In certain embodiments, method 400 may be implemented partially or fully in software and/or firmware embodied in computer-readable media.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

What is claimed is:

1. A method comprising:
    measuring an electrical parameter of an electromagnetic load having a moving mass during the absence of a driving signal actively driving the electromagnetic load, wherein the electrical parameter comprises a back-electromotive force associated with the electromagnetic load;
    measuring a mechanical parameter of mechanical motion of a host device comprising the electromagnetic load, wherein the mechanical parameter comprises a velocity of the host device;
    correlating a relationship between the mechanical parameter and the electrical parameter; and
    calibrating the electromagnetic load across a plurality of mechanical motion conditions based on the relationship.

2. The method of claim 1, wherein correlating the relationship comprises calculating based on the back-electromotive and the velocity, for each of a plurality of velocities of the host device, a respective magnetic force factor at such velocity.

3. The method of claim 2, wherein calibrating the electromagnetic load comprises calibrating the electromagnetic load based on the plurality of velocities of the host device and their respective magnetic force factors at each such velocity.

4. The method of claim 2, wherein calibrating the electromagnetic load comprises filtering the driving signal, when actively driving the electromagnetic load, with a filter having a response based on the plurality of velocities of the host device and their respective magnetic force factors at each such velocity.

5. The method of claim 1, further comprising recording the relationship and storing the relationship in computer-readable media.

6. The method of claim 5, wherein calibrating comprises retrieving the relationship from the computer-readable media and calibrating based on the relationship as retrieved from the computer-readable media.

7. The method of claim 1, wherein the mechanical motion is caused by normal use of the host device during its use by an end user of the host device.

8. The method of claim 1, wherein the mechanical motion is caused by a mechanical exciter during post-production calibration of the host device.

9. The method of claim 1, wherein the electromagnetic load comprises a haptic transducer.

10. A system comprising:
    a first input for measuring an electrical parameter of an electromagnetic load having a moving mass during the absence of a driving signal actively driving the electromagnetic load, wherein the electrical parameter comprises a back-electromotive force associated with the electromagnetic load;
a second input for measuring a mechanical parameter of mechanical motion of a host device comprising the electromagnetic load, wherein the mechanical parameter comprises a velocity of the host device; and
a processing subsystem configured to:
correlate a relationship between the mechanical parameter and the electrical parameter; and
calibrate the electromagnetic load across a plurality of mechanical motion conditions based on the relationship.

11. The system of claim 10, wherein correlating the relationship comprises calculating based on the back-electromotive and the velocity, for each of a plurality of velocities of the host device, a respective magnetic force factor at such velocity.

12. The system of claim 11, wherein calibrating the electromagnetic load comprises calibrating the electromagnetic load based on the plurality of velocities of the host device and their respective magnetic force factors at each such velocity.

13. The system of claim 11, wherein calibrating the electromagnetic load comprises filtering the driving signal, when actively driving the electromagnetic load, with a filter having a response based on the plurality of velocities of the host device and their respective magnetic force factors at each such velocity.

14. The system of claim 10, wherein the processing subsystem is further configured to record the relationship and store the relationship in computer-readable media.

15. The system of claim 14, wherein calibrating comprises retrieving the relationship from the computer-readable media and calibrating based on the relationship as retrieved from the computer-readable media.

16. The system of claim 10, wherein the mechanical motion is caused by normal use of the host device during its use by an end user of the host device.

17. The system of claim 10, wherein the mechanical motion is caused by a mechanical exciter during post-production calibration of the host device.

18. The system of claim 10, wherein the electromagnetic load comprises a haptic transducer.

19. A host device comprising:
an electromagnetic load; and
a processing subsystem configured to:
measure an electrical parameter of an electromagnetic load having a moving mass during the absence of a driving signal actively driving the electromagnetic load, wherein the electrical parameter comprises a back-electromotive force associated with the electromagnetic load;
measure a mechanical parameter of mechanical motion of a host device comprising the electromagnetic load, wherein the mechanical parameter comprises a velocity of the host device;
correlate a relationship between the mechanical parameter and the electrical parameter; and
calibrate the electromagnetic load across a plurality of mechanical motion conditions based on the relationship.

* * * * *